(12) United States Patent
Casper et al.

(10) Patent No.: US 6,998,696 B2
(45) Date of Patent: Feb. 14, 2006

(54) INTEGRATED THIN FILM CAPACITOR/INDUCTOR/INTERCONNECT SYSTEM AND METHOD

(76) Inventors: Michael D. Casper, 2 Carol Ann La., Amherst, NH (US) 03031-3335; William B. Mraz, 67 Bald Hill Rd., Newfield, NH (US) 03856-8101

( * ) Notice: Subject to any disclaimer, the term of this patent is extended or adjusted under 35 U.S.C. 154(b) by 0 days.

(21) Appl. No.: 10/686,116

(22) Filed: Oct. 15, 2003

(65) Prior Publication Data

US 2004/0080021 A1 Apr. 29, 2004

Related U.S. Application Data

(62) Division of application No. 09/960,796, filed on Sep. 21, 2001, now Pat. No. 6,761,963.

(51) Int. Cl.
*H01L 29/00* (2006.01)
(52) U.S. Cl. .................. 257/528; 257/532; 257/531
(58) Field of Classification Search ............... 257/528, 257/532, 531
See application file for complete search history.

(56) References Cited

U.S. PATENT DOCUMENTS

| | | | |
|---|---|---|---|
| 3,969,197 A | 7/1976 | Tolar et al. | |
| 4,002,542 A | 1/1977 | Young | |
| 4,002,545 A | 1/1977 | Fehiner et al. | |
| 4,038,167 A | 7/1977 | Young | |
| 4,062,749 A | 12/1977 | Young | |
| 4,364,099 A | 12/1982 | Koyama et al. | |
| 4,408,254 A | 10/1983 | Chu et al. | |
| 4,410,867 A | 10/1983 | Arcidiacono et al. | |
| 4,423,087 A | 12/1983 | Howard et al. | |
| 4,471,405 A | 9/1984 | Howard et al. | |
| 4,599,678 A | 7/1986 | Wertheimer et al. | |
| 4,631,633 A | 12/1986 | Shaulov et al. | |
| 5,122,923 A | 6/1992 | Matsubara et al. | |
| 5,258,886 A | 11/1993 | Murayama et al. | |
| 5,262,920 A | 11/1993 | Sakuma et al. | |
| 5,338,950 A | 8/1994 | Bahl | |
| 5,382,817 A * | 1/1995 | Kashihara et al. | ........... 257/295 |
| 5,390,072 A | 2/1995 | Anderson et al. | |
| 5,436,477 A * | 7/1995 | Hashizume et al. | ........ 257/310 |
| 5,455,064 A | 10/1995 | Chou et al. | |
| 5,539,613 A | 7/1996 | Yamamichi et al. | |
| 5,587,870 A | 12/1996 | Anderson et al. | |

(Continued)

OTHER PUBLICATIONS

Marc De Samber, Nick Pulsford, Marc Van Delden, Robert Milsom; "Low-Complexity MCM-D Technology with Integrated Passives for High Frequency Applications", The International Journal of Microcircuits and Electronic Packaging, vol. 21, No. 2, Second Quarter 1998, pp. 224-229 (ISSN 1063-1674) (International Microelectronics and Packaging Society) [6 pages].

*Primary Examiner*—Laura M Schillinger
(74) *Attorney, Agent, or Firm*—Kevin Mark Klughart

(57) ABSTRACT

A system and method for the fabrication of high reliability capacitors (1011), inductors (1012), and multi-layer interconnects (1013) (including resistors (1014)) on various thin film hybrid substrate surfaces (0501) is disclosed. The disclosed method first employs a thin metal layer (0502) deposited and patterned on the substrate (0501). This thin patterned layer (0502) is used to provide both lower electrodes for capacitor structures (0603) and interconnects (0604) between upper electrode components. Next, a dielectric layer (0705) is deposited over the thin patterned layer (0502) and the dielectric layer (0705) is patterned to open contact holes (0806) to the thin patterned layer. The upper electrode layers (0907, 0908, 1009, 1010) are then deposited and patterned on top of the dielectric (0705).

30 Claims, 16 Drawing Sheets

U.S. PATENT DOCUMENTS

| | | |
|---|---|---|
| 5,643,804 A | 7/1997 | Arai et al. |
| 5,670,408 A | 9/1997 | Yamamichi et al. |
| 5,685,968 A | 11/1997 | Hayakawa et al. |
| 5,693,595 A | 12/1997 | Talisa et al. |
| 5,699,224 A | 12/1997 | Hanamura et al. |
| 5,708,302 A | 1/1998 | Azuma et al. |
| 5,736,448 A | 4/1998 | Saia et al. |
| 5,737,179 A | 4/1998 | Shaw et al. |
| 5,741,722 A * | 4/1998 | Lee .......................... 438/240 |
| 5,745,335 A | 4/1998 | Watt |
| 5,760,432 A | 6/1998 | Abe et al. |
| 5,767,564 A | 6/1998 | Kunimatsu et al. |
| 5,781,081 A | 7/1998 | Arakawa et al. |
| 5,789,323 A * | 8/1998 | Taylor ........................ 438/706 |
| 5,818,079 A | 10/1998 | Noma et al. |
| 5,822,175 A * | 10/1998 | Azuma ..................... 361/321.5 |
| 5,872,040 A | 2/1999 | Wojnarowski et al. |
| 5,874,379 A | 2/1999 | Joo et al. |
| 5,877,533 A | 3/1999 | Arai et al. |
| 5,882,946 A | 3/1999 | Otani |
| 5,883,781 A | 3/1999 | Yamamichi et al. |
| 5,889,299 A | 3/1999 | Abe et al. |
| 5,907,470 A | 5/1999 | Kita et al. |
| 5,912,044 A | 6/1999 | Farooq et al. |
| 5,936,831 A | 8/1999 | Kola et al. |
| 5,943,547 A | 8/1999 | Yamamichi et al. |
| 5,955,774 A * | 9/1999 | Kang ........................ 257/533 |
| 5,973,908 A | 10/1999 | Saia et al. |
| 5,973,911 A | 10/1999 | Nishioka |
| 5,982,018 A | 11/1999 | Wark et al. |
| 6,001,702 A | 12/1999 | Cook et al. |
| 6,023,407 A | 2/2000 | Farooq et al. |
| 6,023,408 A | 2/2000 | Schaper |
| 6,040,594 A | 3/2000 | Otani |
| 6,069,388 A | 5/2000 | Okusa et al. |
| 6,072,205 A | 6/2000 | Yamaguchi et al. |
| 6,075,691 A | 6/2000 | Duenas et al. |
| 6,078,093 A * | 6/2000 | Lee .......................... 257/532 |
| 6,081,417 A * | 6/2000 | Matsuki ..................... 361/311 |
| 6,096,600 A * | 8/2000 | Azami ....................... 438/250 |
| 6,761,963 B1 * | 7/2004 | Casper et al. ............... 428/209 |
| 6,890,629 B1 * | 5/2005 | Casper et al. ............... 428/209 |
| 2002/0089810 A1 * | 7/2002 | Casper et al. ............. 361/306.3 |
| 2003/0030965 A1 * | 2/2003 | Chua et al. ............... 361/306.3 |
| 2004/0080021 A1 * | 4/2004 | Casper et al. ............... 257/528 |
| 2004/0081811 A1 * | 4/2004 | Casper et al. ............... 428/209 |
| 2005/0162236 A1 * | 7/2005 | Casper et al. ............... 333/116 |
| 2005/0175938 A1 * | 8/2005 | Casper et al. ............... 430/319 |

* cited by examiner

*Prior Art*

FIG. 2
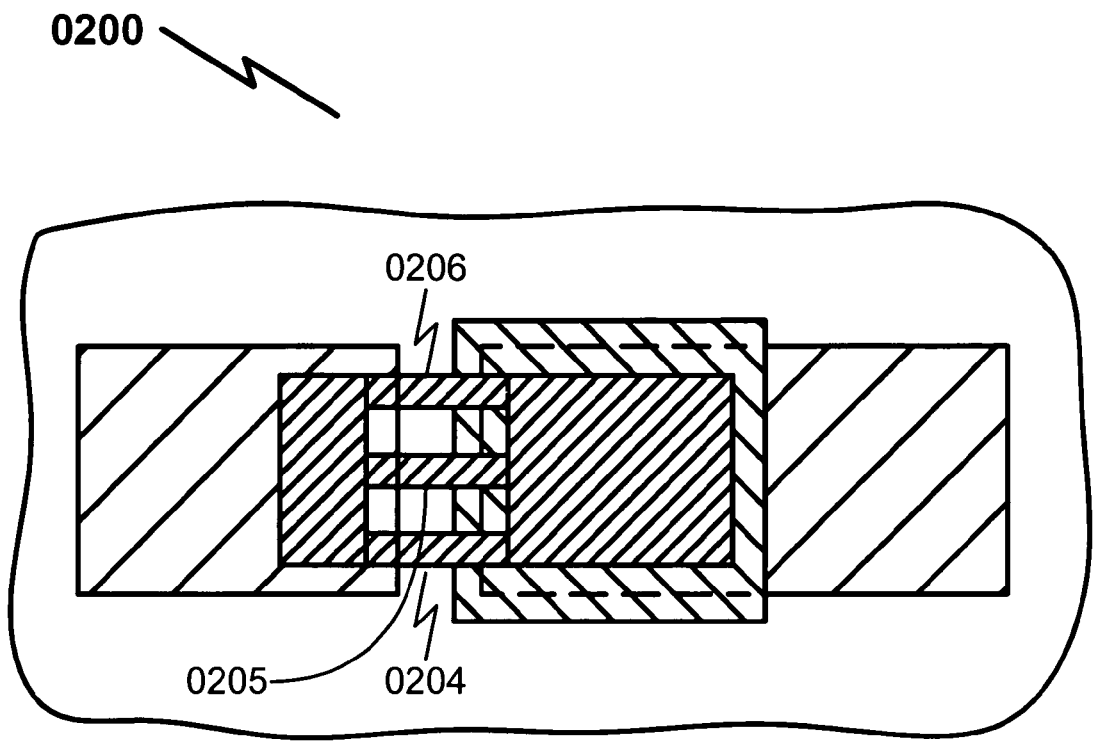
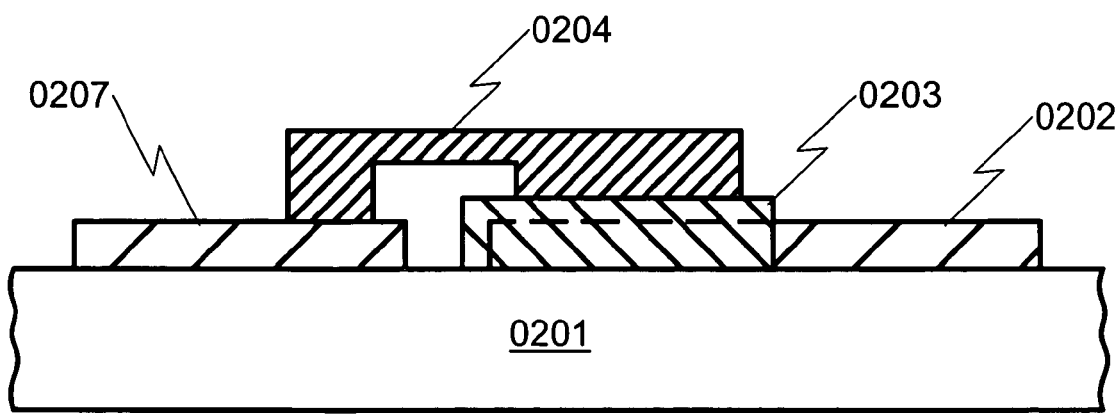
*Prior Art*

*Prior Art*

FIG. 4
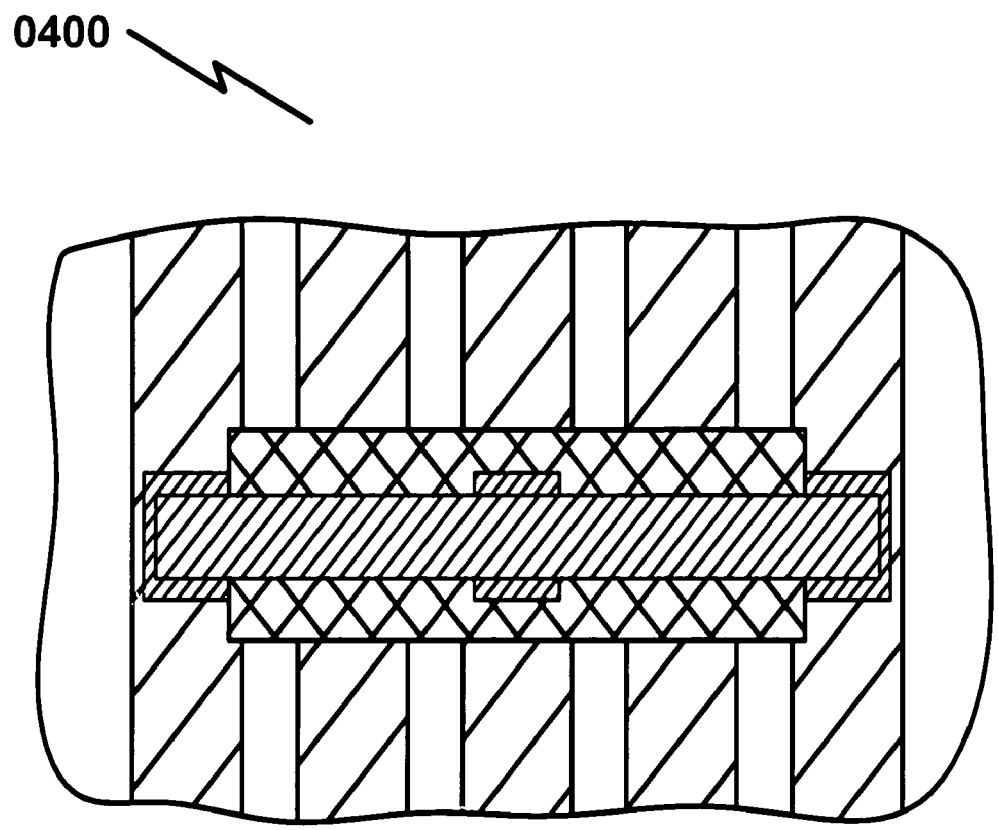
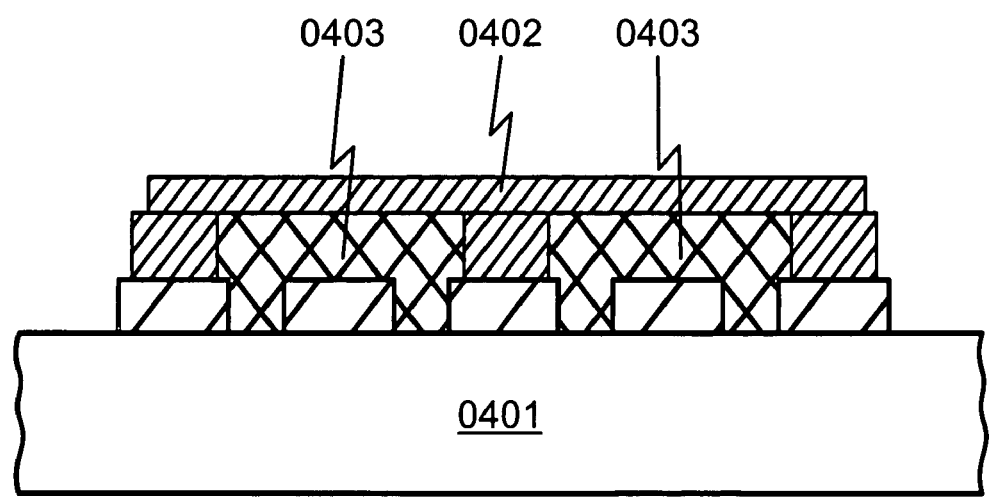
*Prior Art*

FIG. 5
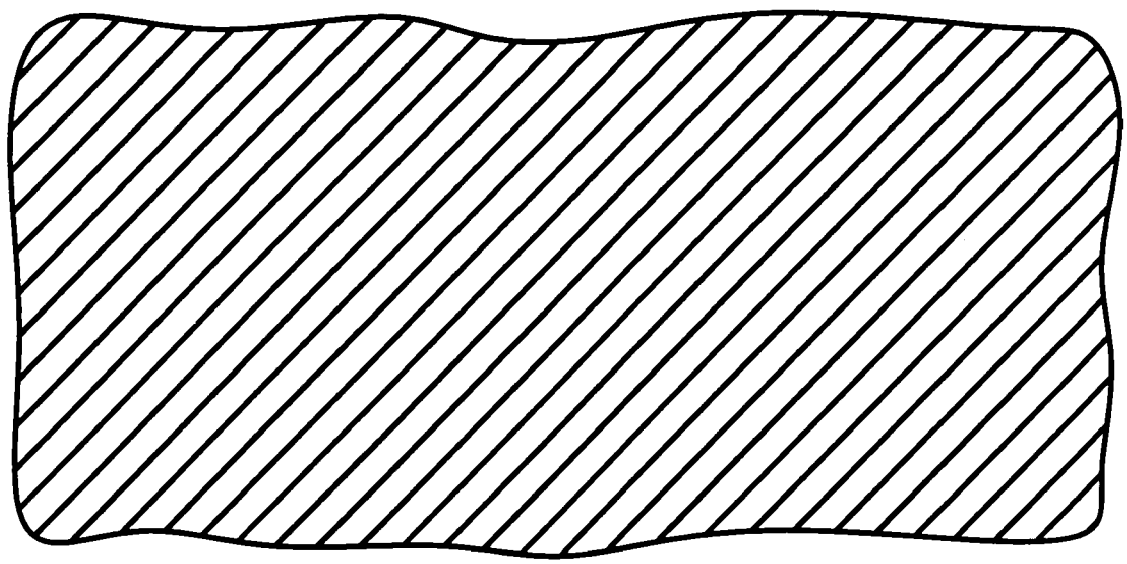
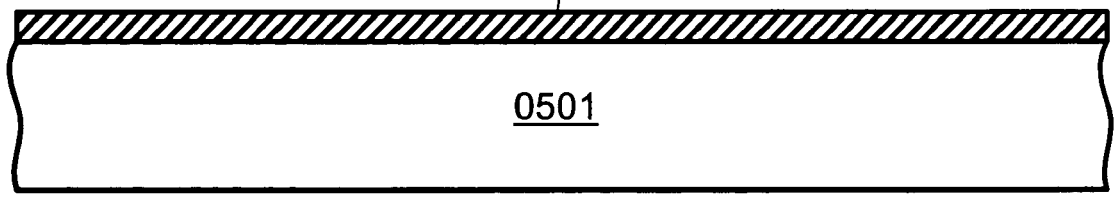

FIG. 8
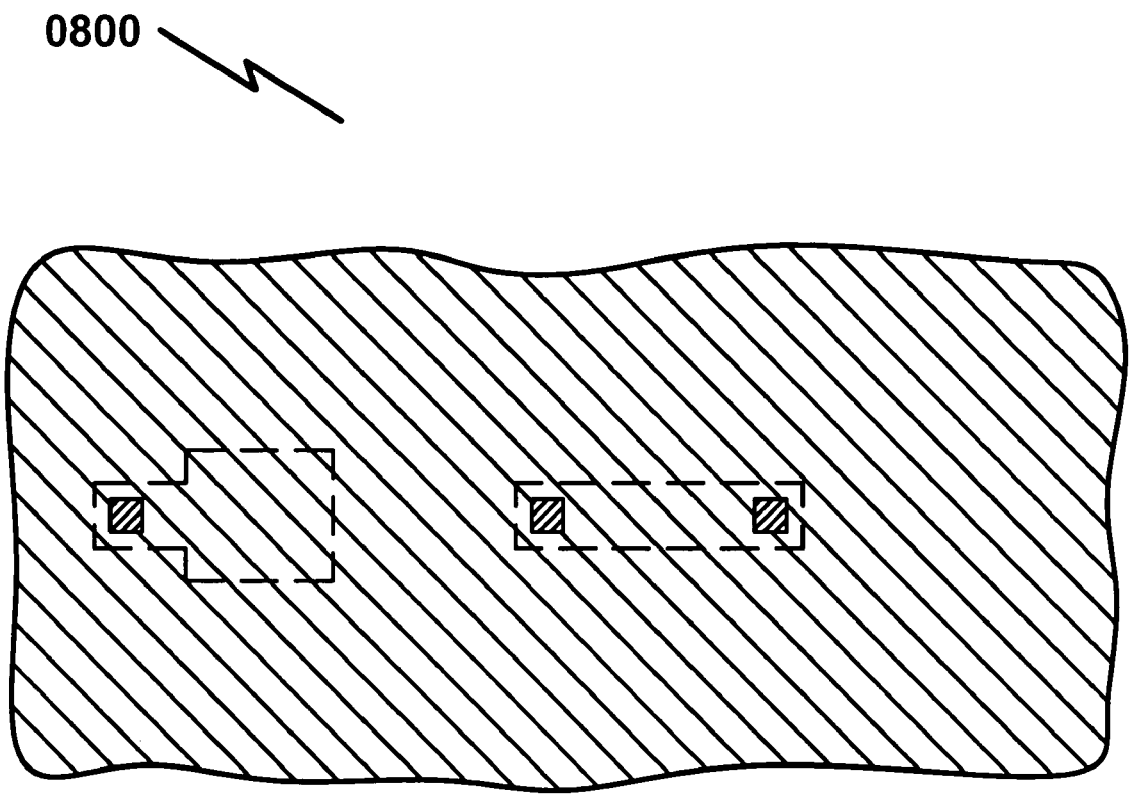
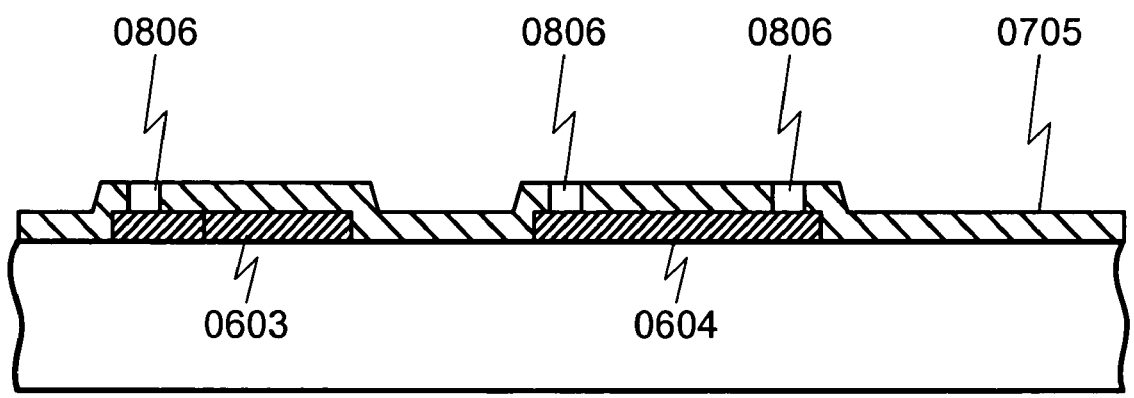

FIG. 15
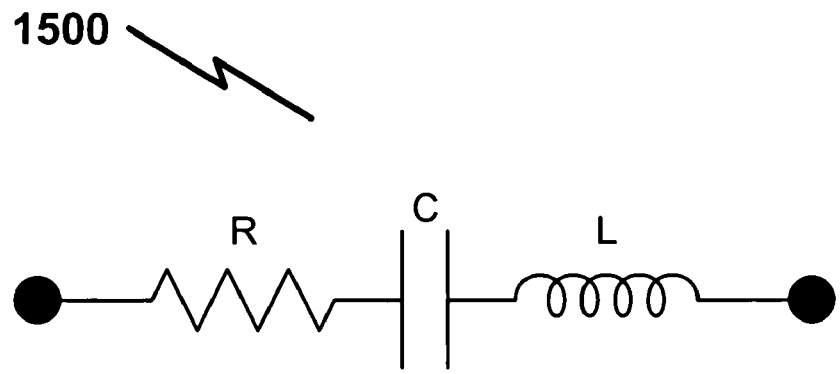
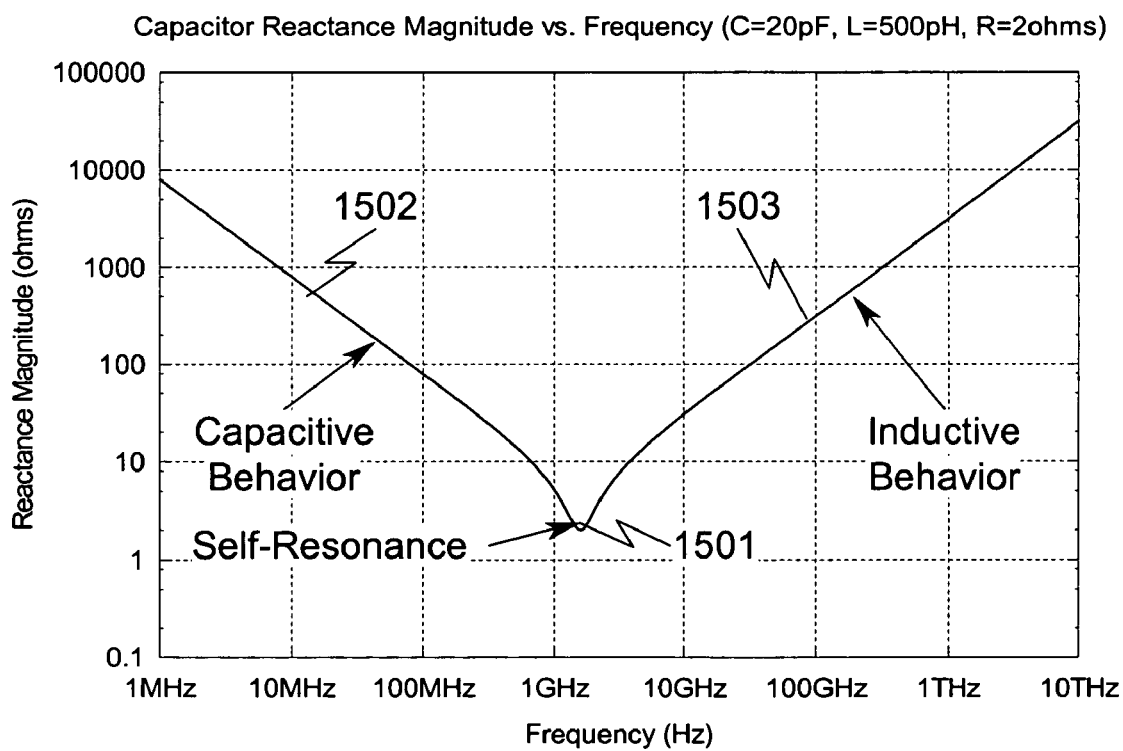

FIG. 16
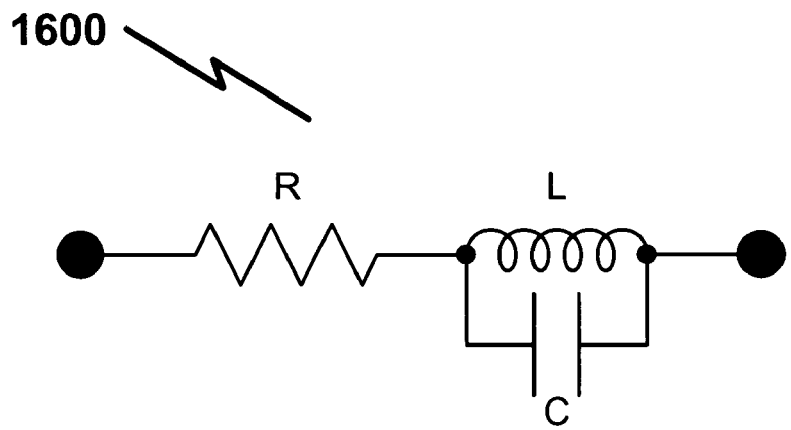
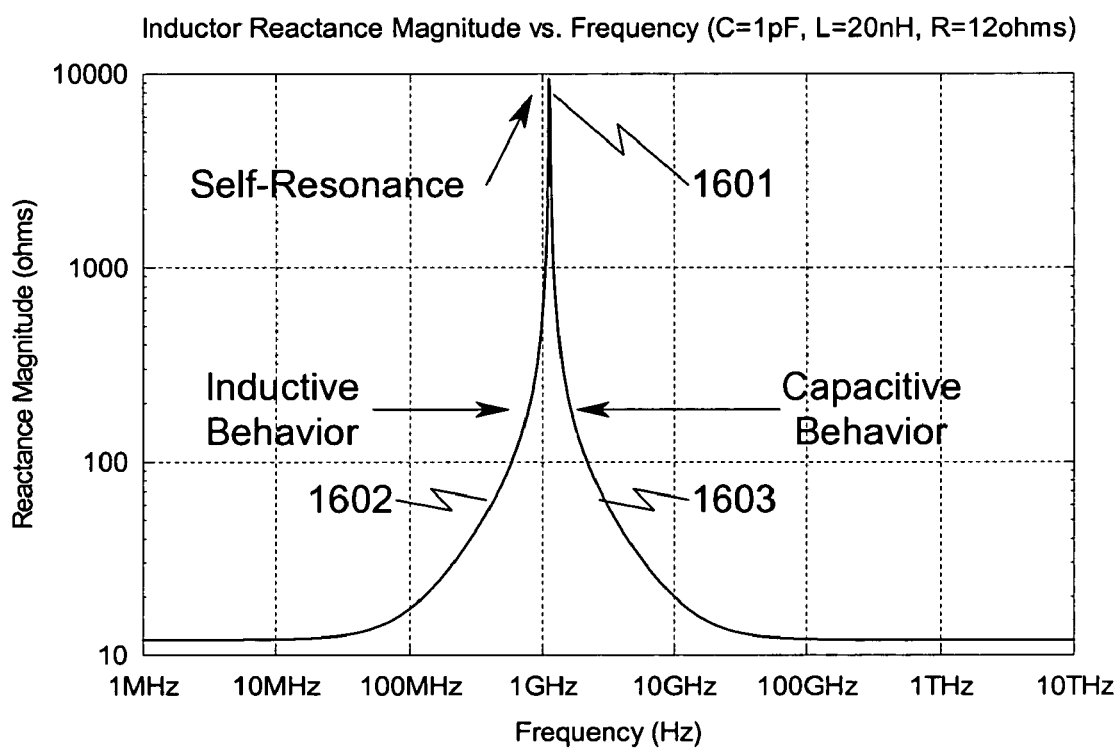

INTEGRATED THIN FILM CAPACITOR/INDUCTOR/INTERCONNECT SYSTEM AND METHOD

CROSS REFERENCE TO RELATED APPLICATIONS

UTILITY PATENT APPLICATIONS

This patent application is a divisional Patent Application for "INTEGRATED THIN FILM CAPACITOR/INTERCONNECT SYSTEM AND METHOD", Ser. No. 09/960,796, filed Sep. 21, 2001 now U.S. Pat. No. 6,761,963. Applicants incorporate this parent application by reference and claim benefit pursuant to 35 U.S.C. § 120 for this previously filed patent application.

PROVISIONAL PATENT APPLICATIONS

Applicant claims benefit pursuant to 35 U.S.C. § 119 and hereby incorporates by reference Provisional Patent Application for "INTEGRATED THIN FILM CAPACITOR/INTERCONNECT SYSTEM AND METHOD", Ser. No. 60/234,135, filed Sep. 21, 2000, and submitted to the USPTO with Express Mail Label EM267139965US.

PARTIAL WAIVER OF COPYRIGHT

All of the material in this patent application is subject to copyright protection under the copyright laws of the United States and of other countries. As of the first effective filing date of the present application, this material is protected as unpublished material.

However, permission to copy this material is hereby granted to the extent that the copyright owner has no objection to the facsimile reproduction by anyone of the patent documentation or patent disclosure, as it appears in the United States Patent and Trademark Office patent file or records, but otherwise reserves all copyright rights whatsoever.

STATEMENT REGARDING FEDERALLY SPONSORED RESEARCH OR DEVELOPMENT

Not Applicable

REFERENCE TO A MICROFICHE APPENDIX

Not Applicable

FIELD OF THE INVENTION

The present invention provides a system and method for fabricating high reliability capacitors, inductors, and multi-layer interconnects on hybrid microelectronic substrate surfaces using thin film technology. Specifically, it employs a thin lower electrode layer under a patterned dielectric layer. Conventional thin film conductors, upper electrodes for capacitors, spiral inductors, and resistor elements are then deposited on top of the dielectric layer to form thin film hybrid microelectronic devices containing conductors, capacitors, inductors, and resistors all integrated together on the same device.

BACKGROUND OF THE INVENTION

Hybrid microelectronic devices are manufactured on a variety of substrate materials using various techniques such as thick film, low temperature co-fired ceramic (LTCC), specialty printed circuit board (PCB), or thin film technology. Hybrid devices are used in many microelectronics applications in the defense, medical, communications, computer, automotive, and infrared imaging industries, as well as in many other applications. In all of these industries there is continuous demand for devices that offer improved performance and function. In order to satisfy these demands, the number of passive devices (capacitors, inductors, and resistors) designed into microelectronic devices continues to grow. For instance, a typical cellular phone product may contain 400 components with less than 20 devices being active (i.e., semiconductors) and the 380 or more devices being passive devices.

Along with demands for better performance are also requirements to provide products that are less expensive and smaller in size. It is reported that the passive components in a cellular phone product can occupy 80% of the printed circuit board area and account for 70% of the product assembly costs. Thus, there is clear need to reduce the size and cost of the passive devices required in microelectronic devices.

Of the hybrid circuit fabrication techniques, thin film technology is extremely well suited for use in RF/microwave, wireless, and optical transmission technologies because of its ability to provide high quality features, extremely dense packaging, and a large range of integrated features.

The current state of the art in thin film hybrid microelectronic manufacturing offers cost effective, high reliability methods for integrating conductors, inductors, and resistors onto the same thin film hybrid circuit device but not capacitors and interconnects (i.e. connections between devices and multiple layers).

Presently, capacitors are typically purchased individually and attached to the thin film devices using various surface mount die attach techniques. The individual chip capacitors take up valuable space, require much assembly labor, and can decrease reliability due to assembly problems.

Interconnects are often required to interconnect components and devices and to attach to the center of spiral inductors and power splitters such as Lange couplers. Current technology uses wire or ribbon bonding to make individual interconnects. Wire or ribbon bonds can add higher costs and sometimes cause high frequency performance problems due to bond inconsistencies, different bond shapes or the bonds falling over and shorting to conductor lines that they are crossing over.

Thus, there is a clear need for a reliable fabrication method that offers both integrated capacitors and integrated interconnects. It is especially desirable that this method provides features that are usable from DC to very high operating frequencies. The prior art does not satisfy this need.

A recent approach to the integration of capacitors and interconnects has concentrated on fabricating these devices on silicon wafers. See MARC DE SAMBER, NICK PULSFORD, MARC VAN DELDEN, ROBERT MILSOM; "Low-Complexity MCM-D Technology with Integrated Passives for High Frequency Applications", The International Journal of Microcircuits and Electronic Packaging, Volume 21, Number 2, Second Quarter 1998, pgs 224–229 (ISSN 1063-1674) (International Microelectronics and Packaging Society).

This paper presented simple concepts for fabricating integrated capacitors, inductors, resistors, and interconnects on silicon wafers. However, processing thin film hybrid substrates offers unique challenges when compared to silicon wafers, and the teachings presented in this prior art are not directly applicable to thin film hybrid substrate processing.

DESCRIPTION OF THE PRIOR ART

Overview

Two basic techniques have been used in the past to fabricate integrated capacitors onto thin film hybrid devices. Both techniques are based on the "parallel plate" construction or MIM (metal-insulator-metal) capacitor design. Both techniques are inherently difficult to manufacture as they need to address the issue of "step coverage" of the dielectric layer over the thick bottom electrode.

Parallel Plate Capacitor With Step Coverage (0100)

FIG. 1 (0100) illustrates a MIM technique whereby a thin lower electrode (0102) is deposited and patterned on a substrate (0101). This lower electrode (0102) is then oxidized or anodized to form a thin oxide layer (0103) on its top surface that then becomes the dielectric layer in the capacitor. An upper electrode layer (0104) is then deposited and patterned on top of the insulator layer (0101) to form a MIM capacitor.

This type of capacitor is very difficult to manufacture as it presents many problems such as capacitance value reproducibility problems, shorting (0106) of the top electrode (0104) to the bottom electrode (0102) through the thin dielectric (0105), low breakdown voltage, low Q (quality factor) at high frequencies, and wire bonding challenges.

The capacitor value or capacitance is inversely proportional to the thickness of the dielectric layer so it is very advantageous to have the dielectric layer as thin as possible. When depositing a thin dielectric layer over a thicker electrode layer electrical shorts are introduced at the edge (0106) of the bottom electrode (0102) due to poor "step coverage" (0105) of the dielectric layer (0103) as shown in FIG. 1 (0100).

Air-Bridge Capacitor (0200)

FIG. 2 (0200) illustrates a MIM technique that uses a thick bottom electrode (0202), a dielectric layer (0203), and air-bridges (0204, 0205, 0206) to crossover to the upper electrode layer (0207). This technique uses multiple deposition and patterning processes to build up and then cross over to the upper electrode layer (0207).

This process is inherently difficult because the lower electrode (0202) is relatively thick, thereby making it problematic to make contact to the upper electrode (0207) without shorting to the thick lower electrode (0202). Most dielectric coatings (0203), in order to be applied at a thickness that will completely cover the lower electrode layer (0202), exhibit extremely low capacitance densities and therefore are used only rarely. Therefore, the air-bridge method becomes a logical method for making a connection to the upper electrode (0207) because it can use thinner dielectrics with higher capacitance densities.

This method exhibits manufacturing and repeatability problems due to its very complex nature. It is extremely expensive and problematic to produce. It also suffers from reliability problems because the air bridges are vulnerable to shorts from handling.

Air-Bridge Interconnects (0300)

In an effort to fabricate integrated interconnects, a "crossover" or "air-bridge" technique has also been employed, as described in FIG. 3 (0300). This technique uses multiple deposition and patterning processes on a substrate (0301) to build up (0303) and then crossover (0304) thick conductor traces (0302) to form interconnects. The processes are typically expensive and therefore can usually only be used in high volume production or in specialty applications that are not cost sensitive. Additionally, the air-bridge spans (0304) are fragile and can be deformed or collapsed by simple handling. It is also important to note that due to the complex nature of the air-bridge process, it is extremely rare for air-bridge interconnects and air-bridge capacitors to be produced on the same device.

Air-Bridge Interconnects with Support (0400)

A more complex version of the simple air-bridge is to support the crossover span (0402) with an underlying insulating material (0403), as illustrated in FIG. 4 (0400). Supported crossovers prevent the cross over span from being deformed and causing it to short to the conductor lines underneath. Usually polyimide is used as the supporting insulation.

The addition of the insulating support (0403) under the span (0402) increases the complexity and cost of the supported crossover process. It is again important to note that due to the complex nature of the supported air-bridge process, it is extremely rare for supported air-bridge interconnects and air-bridge capacitors to be produced on the same device.

Prior U.S. Patents

The prior art in this area relates generally to the following U.S. Pat. Nos.: 3,969,197; 4,002,542; 4,002,545; 4,038,167; 4,062,749; 4,364,099; 4,408,254; 4,410,867; 4,423,087; 4,471,405; 4,599,678; 4,631,633; 5,122,923; 5,258,886; 5,262,920; 5,338,950; 5,390,072; 5,455,064; 5,539,613; 5,587,870; 5,643,804; 5,670,408; 5,685,968; 5,693,595; 5,699,224; 5,708,302; 5,736,448; 5,737,179; 5,745,335; 5,760,432; 5,767,564; 5,781,081; 5,818,079; 5,872,040; 5,874,379; 5,877,533; 5,882,946; 5,883,781; 5,889,299; 5,907,470; 5,912,044; 5,936,831; 5,943,547; 5,973,908; 5,973,911; 5,982,018; 6,001,702; 6,023,407; 6,023,408; 6,040,594; 6,069,388; 6,072,205; 6,075,691.

These patents generally address the following general areas:

1. Fabrication of capacitors on silicon wafers. Unfortunately, the manufacturing techniques utilized here are inapplicable to thin film hybrid substrate fabrication.
2. Fabrication of capacitors on thick film hybrid substrates. While these techniques do permit capacitor fabrication, the performance of these devices is limited and their manufacturing yield is generally low due to step coverage problems and/or problems with crossover bridge spans.
3. Fabrication of capacitors on thick film hybrid substrates using exotic plating techniques. These systems generally have high manufacturing costs and lower device performance than the present invention.

None of the prior art teaches the use of very thin metalization for the bottom plating of capacitors to avoid step coverage problems and improve manufacturing yield.

OBJECTIVES OF THE INVENTION

The present invention provides a system and method for fabricating cost effective, high reliability capacitors and multi-layer interconnects in order to provide the ability to integrate capacitors and interconnects along with conductors, inductors, and resistors all on the same thin film hybrid microelectronic device. Accordingly, the objectives of the present invention are (among others) to circumvent the deficiencies in the prior art and affect one or more of the following:

1. It is an object of this present invention to provide a method for forming capacitors and interconnects on thin film hybrid microelectronic substrates. This method first employs a thin metal layer deposited and patterned on the substrate. This thin patterned layer is used to provide both lower electrodes for capacitor structures and interconnects between upper electrode components. Next, a dielectric layer is deposited over the thin patterned layer and the dielectric layer is patterned to open contact holes to the lower electrode layer. The upper electrode layers are then deposited and patterned on top of the dielectric layer to define the conductors, resistors, and inductors. Thus, by first depositing and patterning the thin lower electrode layer that becomes encapsulated by a suitable dielectric layer under the thick upper electrodes; this invention simply and economically solves many of the problems associated with past methodologies.
2. According to a further object of the present invention, the lower electrode and interconnect layer are made of a material that is mainly gold (Au).
3. According to a further object of the present invention, the lower electrode and interconnect layer are made of a material that is mainly copper (Cu).
4. According to a further object of the present invention, the lower electrode and interconnect layer are made of a material that is mainly silver (Ag).
5. According to a further object of the present invention, the lower electrode and interconnect layer are made of a material that is mainly aluminum (Al).
6. According to a further object of the present invention, the lower electrode and interconnect layer are made of one or more metals selected from a group consisting of tantalum (Ta), tungsten (W), titanium (Ti), nickel (Ni), molybdenum (Mo), platinum (Pt), palladium (Pd), or chromium (Cr).
7. According to a further object of the present invention, the dielectric layer is made of a material that is mainly silicon nitride ($Si_3N_4$).
8. According to a further object of the present invention, the dielectric layer is made of a material that is mainly silicon dioxide ($SiO_2$).
9. According to a further object of the present invention, the dielectric layer is made of a material that is mainly silicon oxynitride ($SiO_xN_x$).
10. According to a further object of the present invention, the dielectric layer is made of a material that is mainly aluminum oxide ($Al_2O_3$).
11. According to a further object of the present invention, the dielectric layer is made of a material that is mainly tantalum pentoxide ($Ta_2O_5$).
12. According to a further object of the present invention, the dielectric layer is made of a material that consists of a ferroelectric material that is mainly $BaTiO_3$, $SrTiO_3$, $BaTiO_3$, $PbZrO_3$, $PbTiO_3$, $LiNbO_3$, or $Bi_{14}Ti_3O_{12}$.
13. According to a further object of the present invention, the dielectric layer is made of a material that is mainly polyimide or benzocyclobutene.
14. According to a further object of the present invention, the substrate material is made of one or more of materials selected from a group consisting of alumina ($Al_2O_3$), beryllium oxide (BeO), fused silica ($SiO_2$), aluminum nitride (AlN), sapphire ($Al_2O_3$), ferrite, diamond, LTCC, or glass.

While these objectives should not be understood to limit the teachings of the present invention, in general these objectives are achieved by the disclosed invention that is discussed in the following sections.

BRIEF SUMMARY OF THE INVENTION

The invention is related in the general area of generating integrated thin film capacitors and other passive components along with associated interconnect. To date, the industry has been unable to commercially fabricate a viable integrated capacitor in the thin film industry. The system and method described in the figures and the following text discloses such a system that can be fabricated using conventional thin film technologies at substantially reduced costs over methods currently used within the industry.

BRIEF DESCRIPTION OF THE DRAWINGS

For a fuller understanding of the advantages provided by the invention, reference should be made to the following detailed description together with the accompanying drawings wherein:

FIG. 2 illustrates a prior art air-bridge parallel plate capacitor structure;

FIG. 4 illustrates a prior art air-bridge interconnect structure incorporating polyimide crossover span supports;

FIG. 5 illustrates a sectional view for illustration of the process for forming integrated capacitors and interconnects on a substrate (0501) according to the present invention and illustrates the step of metalizing (0502) the substrate (0501) with the lower electrode and interconnect layer (0502);

FIG. 8 illustrates a view similar to FIG. 8 but illustrates a further step of forming contact holes (0806) to the lower electrodes and interconnects;

FIG. 15 illustrates typical performance of the capacitors fabricated using the teachings of the present invention;

FIG. 16 illustrates typical performance of the inductors fabricated using the teachings of the present invention.

DESCRIPTION OF THE PRESENTLY PREFERRED EXEMPLARY EMBODIMENTS

Embodiments are Exemplary

Figure 1:
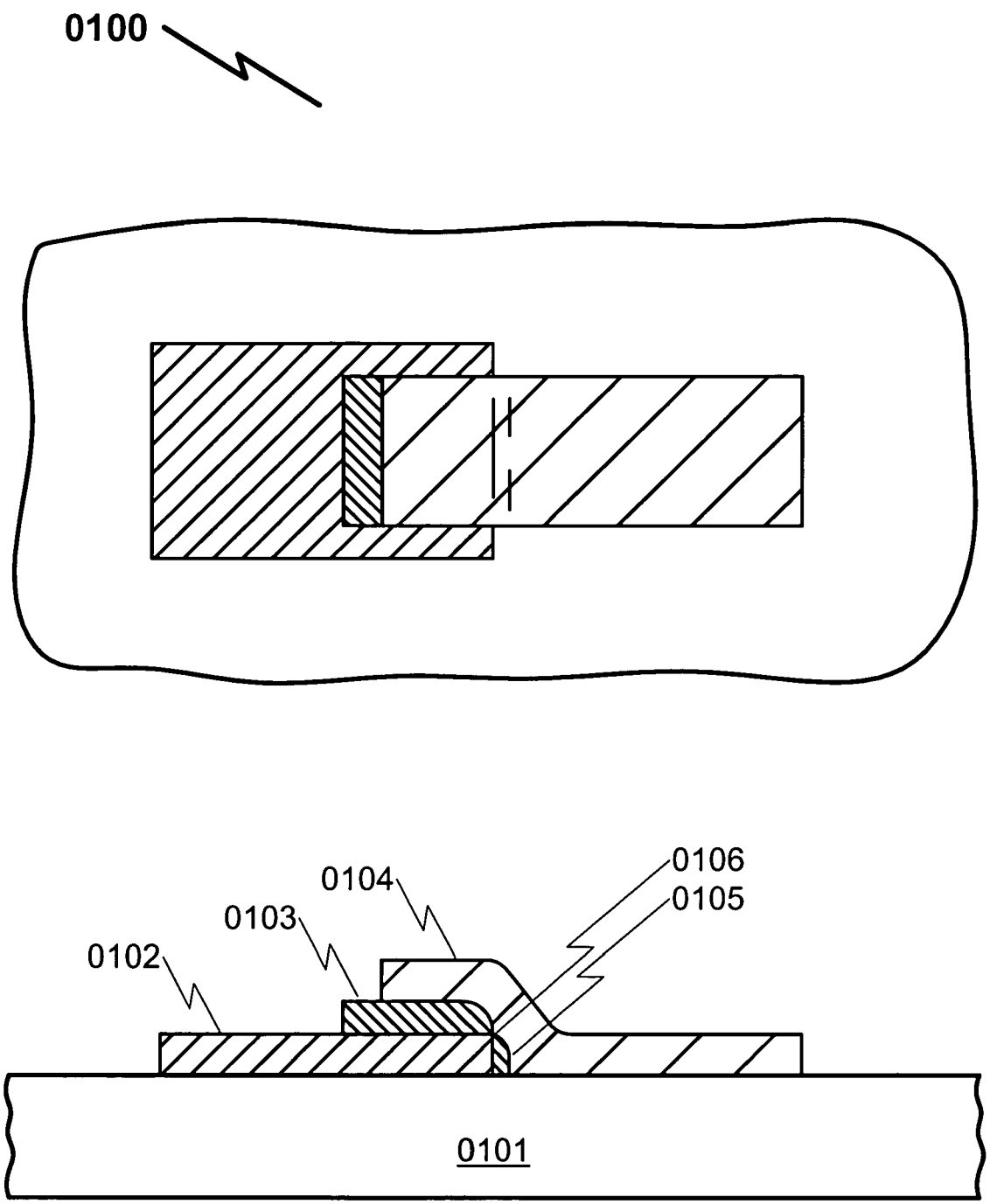
FIG. 1 illustrates a prior art parallel plate capacitor structure with "step coverage" defects.

While this invention is susceptible of embodiment in many different forms, there is shown in the drawings and will herein be described in detailed preferred embodiment of the invention with the understanding that the present disclosure is to be considered as an exemplification of the principles of the invention and is not intended to limit the broad aspect of the invention to the embodiment illustrated.

The numerous innovative teachings of the present application will be described with particular reference to the presently preferred embodiments, wherein these innovative teachings are advantageously applied to the particular problems of an INTEGRATED THIN FILM CAPACITOR/INDUCTOR/INTERCONNECT SYSTEM AND METHOD. However, it should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and visa versa with no loss of generality.

System (0500, 0600, 0700, 0800, 0900, 1000)

Referring to the system as described in FIGS. 5–11 (0500, 0600, 0700, 0800, 0900, 1000, 1100) and method as described in FIG. 14 (1400), a substrate and method for forming same containing integrated capacitors, inductors and/or interconnects along with conductors and/or resistors will now be described.

[1] Metalization (1401)

As shown in FIG. 5 (0500), a substrate (0501) is metalized (0502) on one or both sides by sputtering, evaporation, or chemical vapor deposition (1401).

This layer (0502) is typically formed of a lower adhesive layer and an upper conducting layer. Key to the success of the present invention is keeping the total thickness of this metalized layer (0502) at or below approximately 1.50 $\mu$m.

The prior art universally teaches the use of base metalization layers on the order of 2–4 $\mu$m in thickness that makes step coverage difficult in all known capacitor/inductor/interconnect fabrication processes. The present invention breaks with this methodology and utilizes a much thinner adhesive/conducting layer combination to achieve reliable step coverage and superior passive component performance.

The lower adhesive layer is generally very thin (~0.03–0.05 $\mu$m) and is optimally comprised of chrome (Cr), titanium (Ti), or titanium-tungsten (Wti), although other adhesive conducting materials are also known in the art. The purpose of this layer is to generally act as a bonding interface between the substrate (0501) and the conducting layer (0502).

The upper conducting layer is generally thicker (~0.25 $\mu$m) than the lower adhesive layer and may be comprised of any of a wide variety of metals, but preferred embodiments utilize gold (Au), copper (Cu), aluminum (Al), silver (Ag), tantalum (Ta), tungsten (W), titanium (Ti), nickel (Ni), molybdenum (Mo), platinum (Pt), and/or palladium (Pd). The combination of the lower adhesive layer and upper conducting layer serves as the bottom electrode layer (0502).

[2] Align/Expose/Etch Lower Electrodes (1402)

Figure 6:
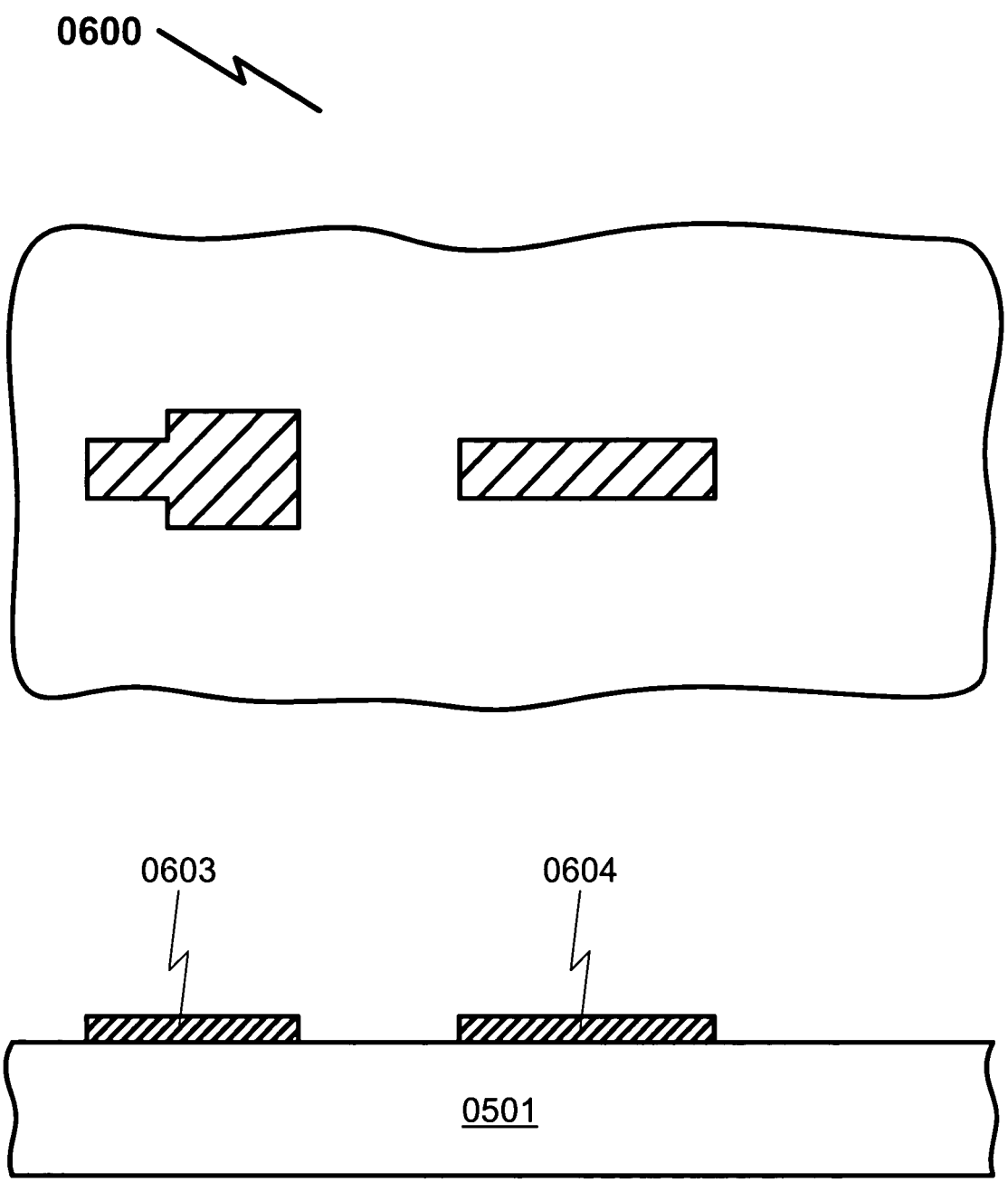
FIG. 6 illustrates a view similar to FIG. 5 but illustrates a further step of forming the individual lower electrodes (0603) for the capacitors and the interconnects (0604)

A photoresist (not shown) is then applied, imaged, and the substrate etched (1402) to form the desired patterns for the lower electrodes of the capacitors (0603) and any interconnects (0604), as shown in FIG. 6 (0600).

[3] Apply Dielectric Layer (1403)

Figure 7:
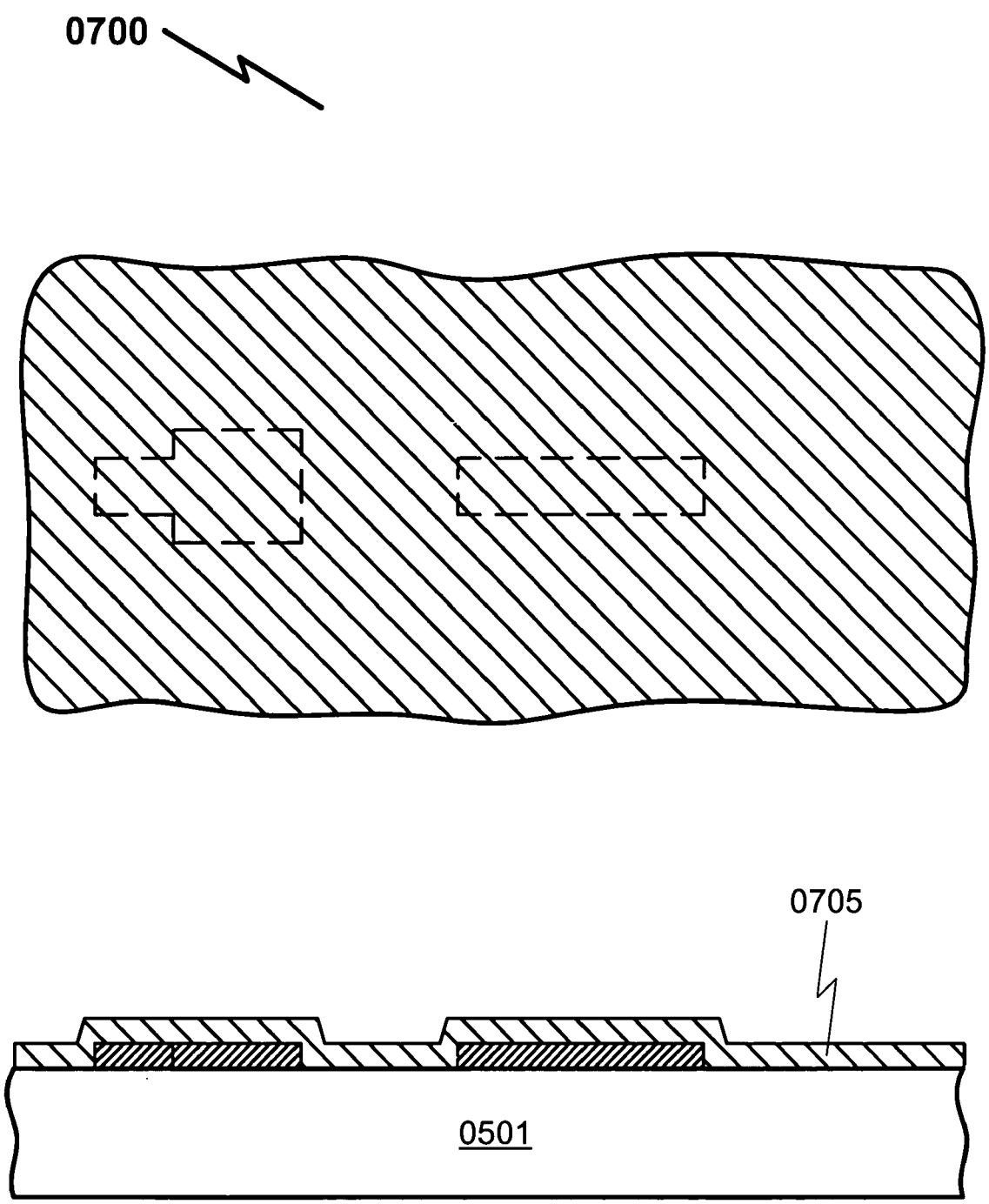
FIG. 7 illustrates a view similar to FIG. 6 but illustrates a further step of applying the dielectric layer (0705) on top of the patterned individual lower electrodes and the interconnects.

Then, as shown in FIG. 7 (0700), the dielectric layer of silicon nitride (0.3 $\mu$m) (0705) is applied to the entire substrate (0501) surface by chemical vapor deposition (CVD) (1403). One skilled in the art will recognize that other dielectric layer materials are possible. While silicon nitride is a preferred dielectric, a wide variety of other materials are anticipated by the present invention and detailed later in this document.

[4] Align/Expose/Etch Contact Holes (1404)

Thereafter, as shown in FIG. 8 (0800), a photoresist (not shown) is then applied, imaged, and the substrate is plasma etched (1404) to form the contact holes (0806) in the dielectric layer (0705) in order to be able to make electrical contact to the lower electrodes of the capacitors (0603) and the interconnect (0604).

Note also that in many applications it will be advantageous to selectively pattern the dielectric layer to remove certain portions of dielectric under the upper level metalization. This optional selective patterning can easily be accomplished in this same step. Rationales for this selective patterning procedure may be associated with improving the electrical performance of various capacitor/inductor/interconnect/resistor components, as one skilled in the art will readily recognize.

[5] Metalize Substrate to Make Contact With Lower Electrodes (1405)

Figure 9:
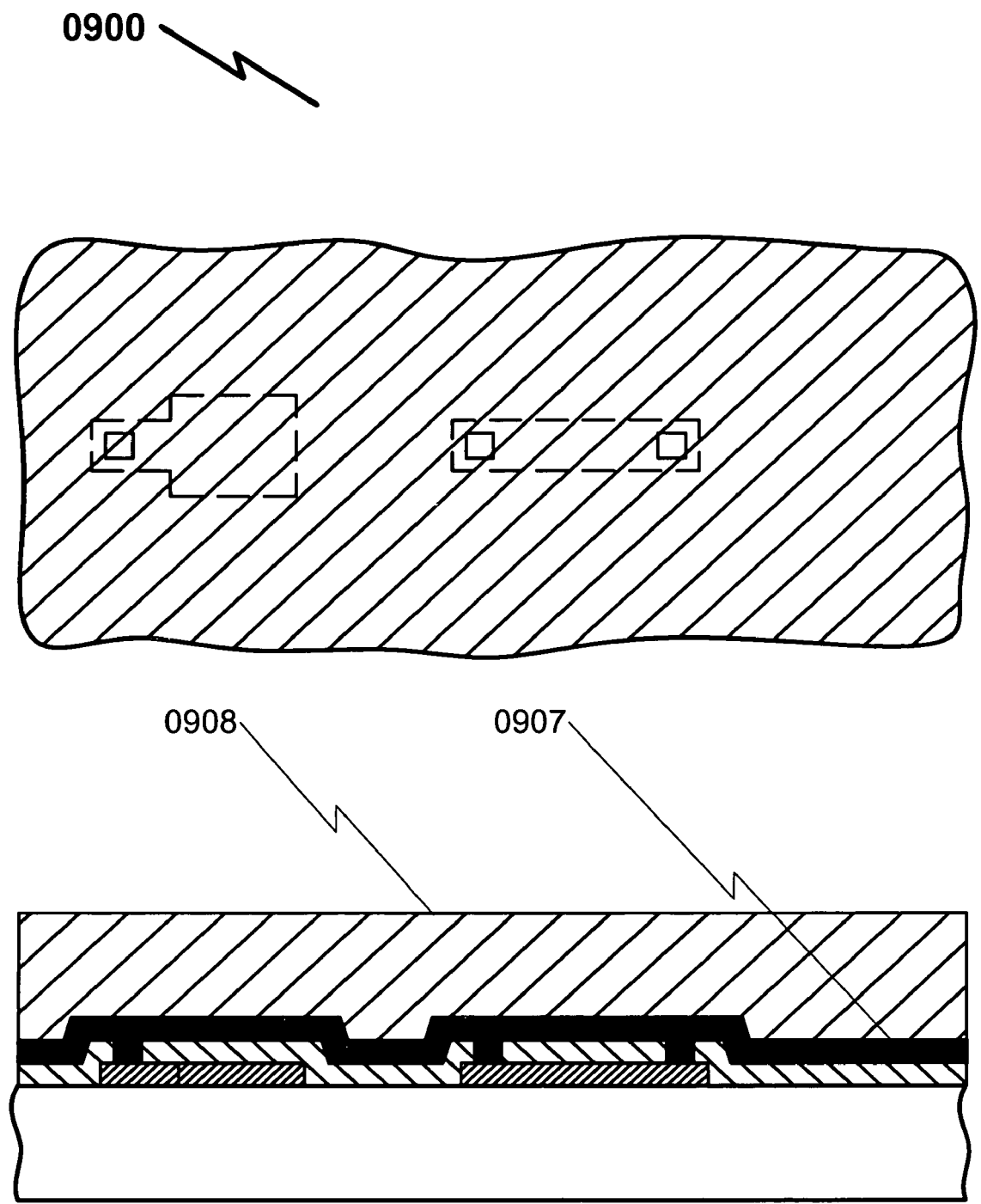
FIG. 9 illustrates a view similar to FIG. 8 but illustrates a further step of metalizing the top of the dielectric layer (0705) with the conductor (0907, 0908) and optional resistor layers.

FIG. 9 (0900) shows that the substrate is then metalized with the upper electrode metal layers by sputtering, evaporation, chemical vapor deposition, and/or electroplating (1405). These metal layers (0907, 0908) are commonly tantalum nitride (to serve as the resistor layer) under WTi (0.05 $\mu$m) (0907) under Au (2–5 $\mu$m) (0908). These metal layers coat the entire substrate surface and make contact to the lower electrode and interconnect patterns through the contact holes.

[6] Align/Expose/Etch Upper Electrode/Inductor/Conductor (1406)

Figure 10:
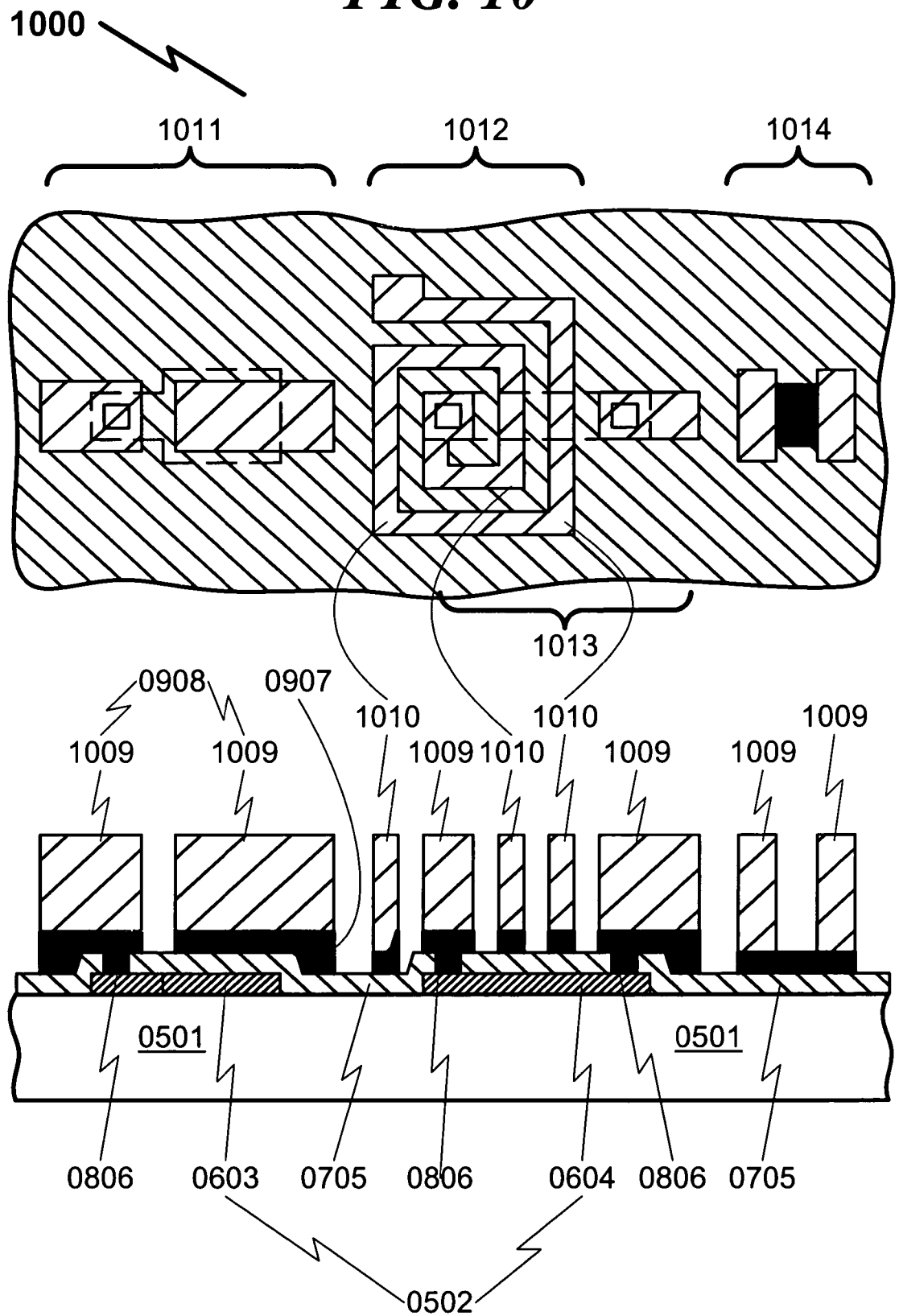
FIG. 10 illustrates a view similar to FIG. 9 but illustrates a further step of patterning the conductor layer with the individual upper electrodes (1009), capacitors (1011), spiral inductors (1012), interconnect (1013), and optional resistor elements (1014)

Thereupon, as shown in FIG. 10 (1000), photoresist (not shown) is applied, imaged, and the substrate is etched (1406) to form the conductor layer features, upper electrode pads (1009), and optional spiral inductors (1010). One skilled in the art will recognize that a wide variety of spiral inductor geometries are possible using the teachings of the present invention, and are not limited to the specific spiral inductor illustrated (1010).

[7] Optionally Form Resistor Elements (1407)

In FIG. 10 (1000) the resistor elements (1014) are optionally formed by applying photoresist (not shown), imaging the photoresist, and then etching the resistor layer (1407).

Construction Variations

From the foregoing, it will be understood by one skilled in the art that according to the present invention a lower electrode and interconnect layer formed using a high conductivity material such as Au, Ag, Cu, or Al will offer excellent high frequency characteristics.

It will be further understood that according to the present invention the dielectric material and thickness can be chosen to optimize capacitance values and/or breakdown voltage.

It will be further understood that according to the present invention to integrate capacitors and interconnects on a variety of thin film hybrid substrates and surface finishes along with conductors, inductors, and resistor elements.

Summary

In summary, it will be understood by one skilled in the art that according to the present invention it becomes possible to integrate capacitors, inductors, and/or interconnects on a thin film hybrid substrate along with conductors and/or resistor elements in a wide variety of configurations.

Method (1400)

Figure 14:
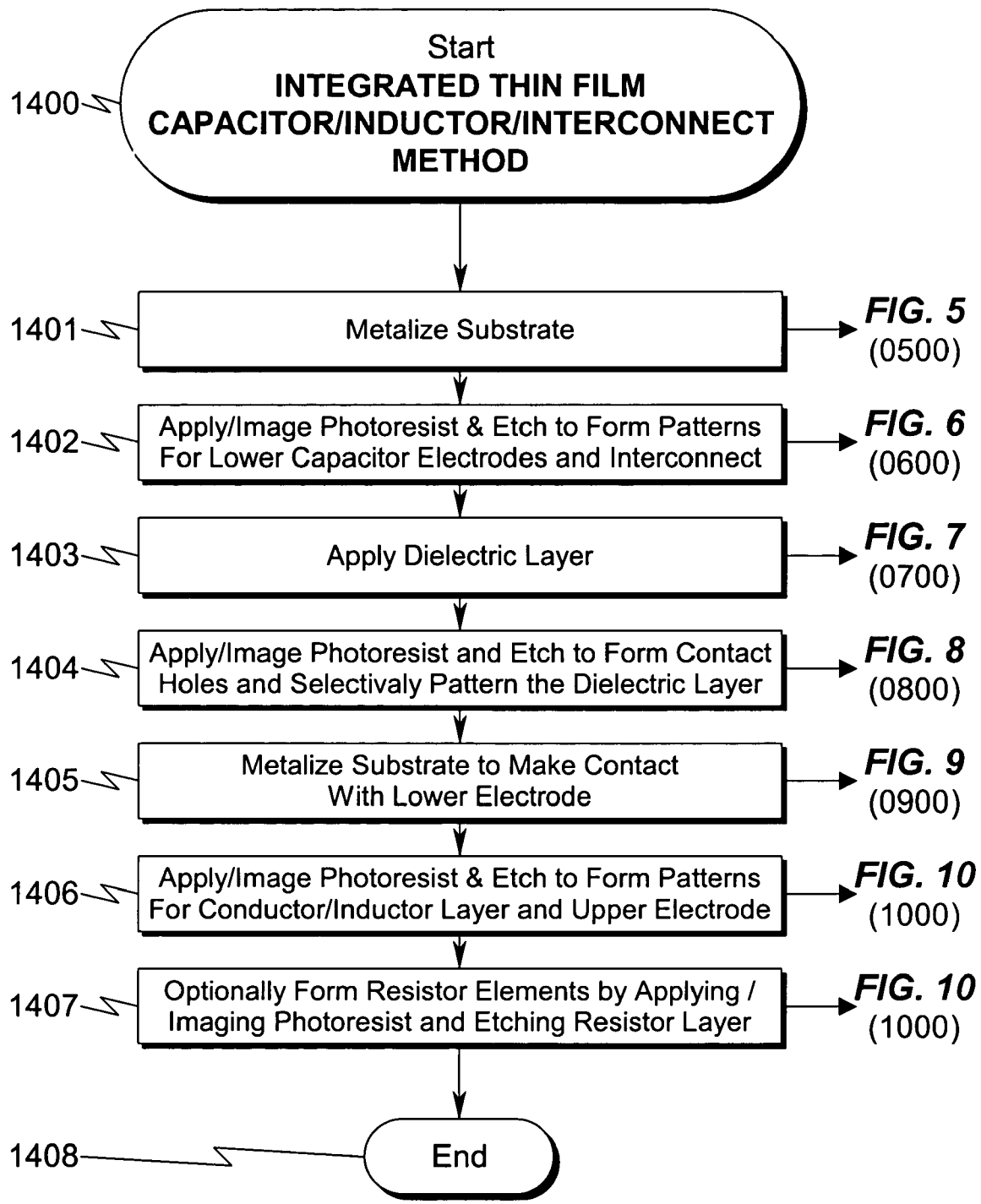
FIG. 14 illustrates an exemplary process flowchart that implements a fabrication method taught by the present invention.

As described previously, the exemplary method used to fabricate the capacitor/inductor/interconnect of the present invention is illustrated in FIG. 14 (1400) and is summarized in the following steps:

1. metalize the substrate with a thin metal overcoat (1401);
2. align/image photoresist and etching to form patterns for lower capacitor electrodes and interconnect (1402);
3. apply the thin dielectric layer (1403);
4. apply/image the photoresist and etch to form contact holes (1404);
5. metalize substrate to make contact with lower electrodes (1405);
6. apply/image photoresist and etch to form patterns for conductor/inductor layer and upper electrode (1406); and
7. optionally form resistor elements by applying/imaging photoresist and etching resistor layer (1407).

Key to this process is the thin application of metalization in step (1) to allow the use of a thin dielectric layer in step (2) to minimize the impact of step coverage reliability problems that are present in the prior art.

System/Method Variations

Material Variations

The present invention is amenable to a wide variety of system/method variations, some of which include the following:

1. The lower electrode and interconnect layer may be comprised of materials that are mainly gold (Au), copper (Cu), silver (Ag), aluminum (Al).
2. The lower electrode and interconnect layer may be comprised of materials that are made of one or more metals selected from a group consisting of tantalum (Ta), tungsten (W), titanium (Ti), nickel (Ni), molybdenum (Mo), platinum (Pt), palladium (Pd), or chromium (Cr).
3. The dielectric layer may be comprised of materials that are made of a material that is mainly silicon nitride ($Si_3N_4$), silicon dioxide ($SiO_2$), silicon oxynitride ($SiO_xN_x$), aluminum oxide ($Al_2O_3$), or tantalum pentoxide ($Ta_2O_5$).
4. The dielectric layer may be comprised of materials that that consists of a ferroelectric material that is mainly $BaTiO_3$, $SrTiO_3$, $BaTiO_3$, $PbZrO_3$, $PbTiO_3$, $LiNbO_3$, or $Bi_{14}Ti_3O_{12}$.
5. The dielectric layer may be comprised of a material that is mainly polyimide or benzocyclobutene.
6. The substrate may be comprised of materials that are selected from a group consisting of alumina ($Al_2O_3$), beryllium oxide (BeO), fused silica ($SiO_2$), aluminum nitride (AlN), sapphire ($Al_2O_3$), ferrite, diamond, LTCC, or glass.

Note that while these variations constitute preferred embodiments of the present invention, they are not limitive of the teachings of the present invention.

Bypass/Decoupling/Filter Capacitor Variant (1100)

Figure 11:
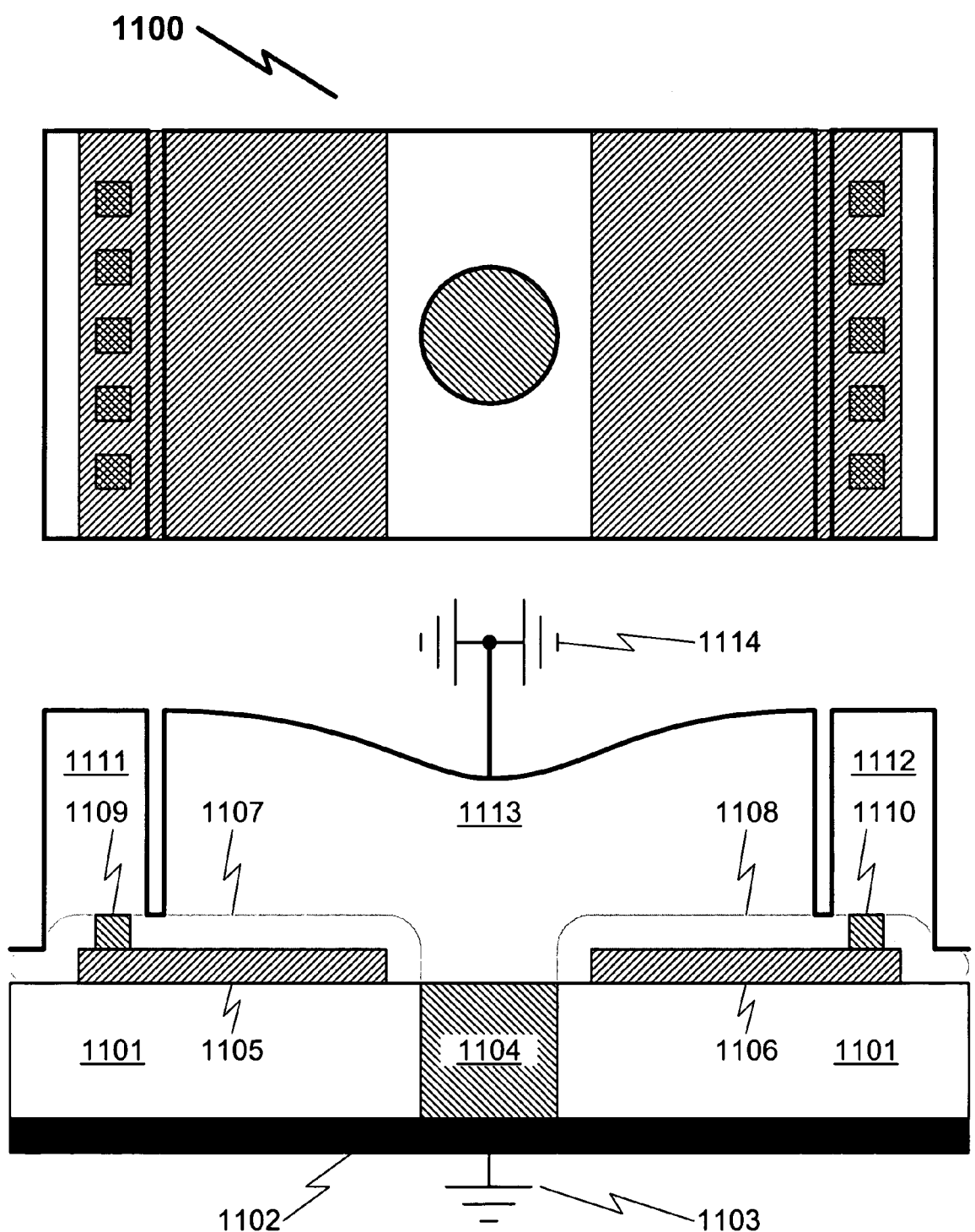
FIG. 11 illustrates an exemplary bypass/decoupling/filter capacitor application structure using the teachings of the present invention.
Figure 12:
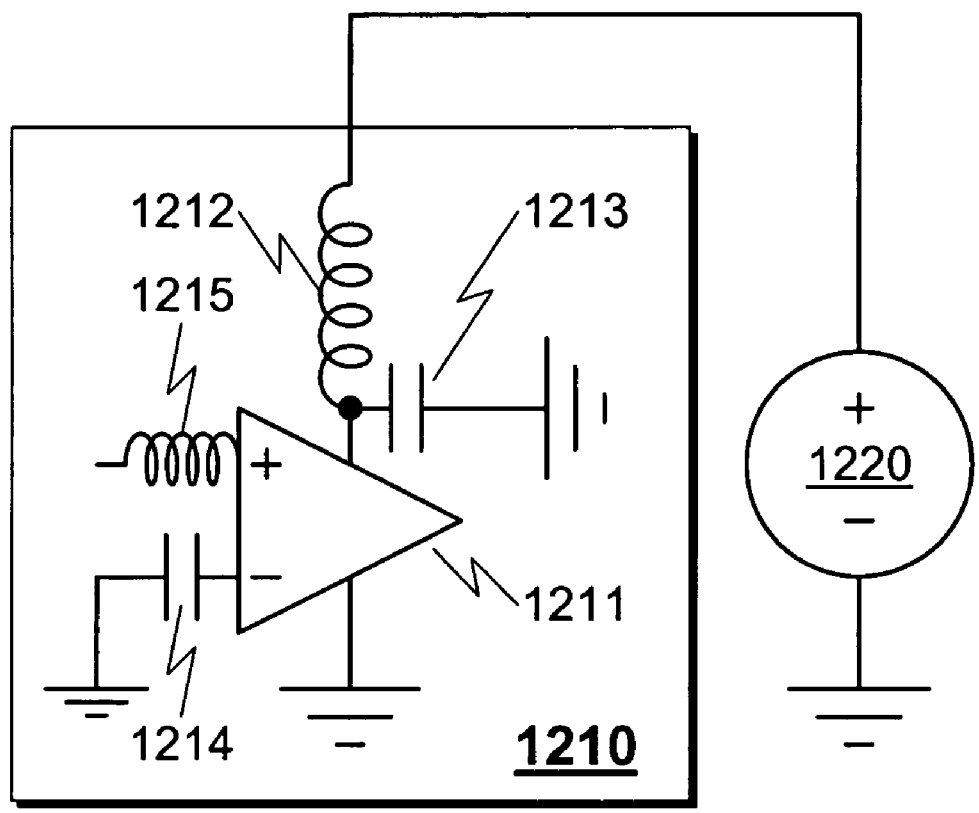
FIG. 12 illustrates an exemplary bypass/decoupling/filter capacitor application in which the teachings of the present invention are particularly advantageous.

An important variation of the exemplary system/method involves the bypass/decoupling/filter capacitor structure illustrated in FIG. 11 (1100). As illustrated in FIG. 12 (1200), a large number of RF/microwave applications involve amplifier systems (1210) that have a need for decoupling (1213) and/or filter (1214) capacitors that have one plate grounded.

The present invention when applied to this typical application is presented by the exemplary construction diagram of FIG. 11 (1100). In this application, the substrate (1101) is generally metalized on the back surface (1102) and this back surface is grounded (1103). A contact grounding via (1104) is drilled through the substrate (1101) and metallized or filled to make contact with the grounded (1103) metalization (1102). This via then makes contact with the top layer of interconnect metalization (1113) that forms the top plate of the capacitor structures. This forms an electrical ground connection (1114) between the upper capacitor plate metalization (1113) and the back plate metalization (1102) by means of the via contact (1104).

The capacitor structures generally comprise thinly deposited lower plates (1105, 1106) and an overcoat of dielectric (1107, 1108). Contact to the lower plates (1105, 1106) is made with via contacts (1109, 1110) through the dielectric, which make contact with upper layers of thick metalized interconnect (1111, 1112).

The advantage of this structure is evident when compared to the prior art because it permits the ground contact of the capacitor to be placed within the capacitor, thus reducing both the series resistance of the capacitor contacts as well as the inductance normally associated with crossover spans and other interconnect associated with techniques used in the prior art.

It is important to note that within the context of the prior art, the lower capacitor plates (1105, 1106) would normally be formed as thick metalization comparable to the top interconnect (1111, 1112, 1113), thus making step coverage of the dielectric layer (1107, 1108) problematic and unreliable. The construction technique and materials taught by the present invention overcome these deficiencies in the prior art and provide for a higher degree of performance and reliability than possible with prior art structures.

One skilled in the art will recognize that the capacitor structure depicted in FIG. 11 (1100) depicts two separate capacitor structures having two bottom plates (1105, 1106) with corresponding dielectric layers (1107, 1108). This illustrates how a single ground contact via (1104) and top plate (1113) may be shared among proximal capacitors. This improves the area efficiency of the overall capacitor structure and permits multiple capacitors to be paralleled for bypass/decoupling/filtering purposes. This parallelism tends to improve the overall function of these devices in a given application, and may also be used to isolate power supply noise between various stages within a given active amplifier (1211) or other active element.

Product By Process

Referring to the system as described in FIGS. 5–11 (0500, 0600, 0700, 0800, 0900, 1000, 1100) and method as described in FIG. 14 (1400), the resulting product containing integrated capacitors, inductors and/or interconnects along with conductors and/or resistors will now be discussed.

What is significant to note about the individual capacitors, inductors, and interconnect (fabricated using the method illustrated herein and for which an exemplary flowchart is given in FIG. 14 (1400)), is that the electrical characteristics of these components are superior to that possible with the prior art. This difference in kind is possible because:

1. The parasitic inductance associated with the capacitors formed using the teachings of the present invention is necessarily lower than that of the prior art. This is because the length of interconnect required to actually connect the capacitor to the remainder of the hybrid circuit need not use crossover spans as in the prior art. These crossover spans tend to add parasitic capacitance that reduces the self-resonant frequency of the capacitor.
2. Additionally, the parasitic resistance of the capacitor structures is reduced as compared to the prior art because crossover spans and additional interconnect required by the prior art has a finite resistance which reduces the quality factor (Q) of the capacitor structure. This parasitic resistance is well known by one skilled in the art as "effective series resistance" and is necessarily a degradation of device performance.
3. The parasitic capacitance associated with the inductors and interconnect using the teachings of the present invention is significantly lower than that of the prior art. This is in part because the prior art has difficulty in controlling the dielectric thickness of the sidewalls (0105) of the upper layer conducting layers.
4. The present invention has significantly better reliability and manufacturability because of the improvement in step coverage as compared to the prior art. As illustrated in FIG. 1 (0106), the potential for sidewall punchthrough or shorting is a significant drawback of the prior art. This potential defect reduces manufacturing yields, causes failures in the field, and generally increases the final cost of the manufactured hybrid system.
5. Note that since the reliability of a system containing multiple capacitors, inductors, and interconnects is determined by the weakest link in the system, an large array of hybrid components having poor individual reliability drastically increases the cost of the overall system because of the reduced overall system reliability.
6. Note that in space-constrained designs and also high performance designs, the ability to overlap ground contact vias (1104) with an overlapping capacitor structure increased the area efficiency and high frequency performance of bypass/decoupling/filtering capacitor structures. This is a significant performance improvement over the prior art.

One skilled in the art will no doubt observe other advantages to the present invention as compared to the prior art.

EXEMPLARY SYSTEM APPLICATIONS

Overview

While a wide variety of system applications are amenable to use of the present invention, several are preferred and will now be discussed. Discussion of these applications in no way limits the scope of the present invention.

Bypass/Decoupling/Filter Systems (1200)

One application of the present invention is in bypass/decoupling/filter systems as illustrated in FIG. 12 (1200). In this application (1200), an amplifier system (1210) is supplied by some external power supply (1220). Typically in RF/microwave applications these systems (1210) comprise an amplifier (1211) which is fed with power via an inductor (1212)/capacitor (1213) filter. In this application it is very important that the capacitor (1213) be placed physically close to the amplifier (1211) to minimize its inductance and raise its self-resonant frequency.

The present invention is particularly well suited to this application because it permits the inductor (1212) and capacitor (1213) to be fully integrated on the same substrate in close proximity to the amplifier (1211). Furthermore, the thin dielectric and low effective series resistance of the capacitors constructed using the techniques of the present invention permit the power supply bypass/decoupling/filtering operation of the capacitor (1213) to be superior to the use of any chip-capacitor alternative. The reason for this is that any chip-capacitor alternative will have significant inductance associated with bond pads and bonding sidewalls of the chip-capacitor, thus reducing its effective capacitance at high frequencies.

Additionally, other capacitors (1214) and/or inductors (1215) that may be associated with the amplifier (1211) within the context of the amplifier subsystem (1210) are also amenable to implementation using the present invention. Applications for these components will vary based on the specific function of the amplifier system (1210). Note that in addition to capacitors (1214) and inductors (1215), the present invention also permits integration of resistor elements in close proximity to the amplifier (1211), which further increases the performance and reliability of the manufactured system while reducing the overall cost of the completed subsystem (1210).

Active/Passive Element Phased Antenna Arrays (1300)

Figure 13:
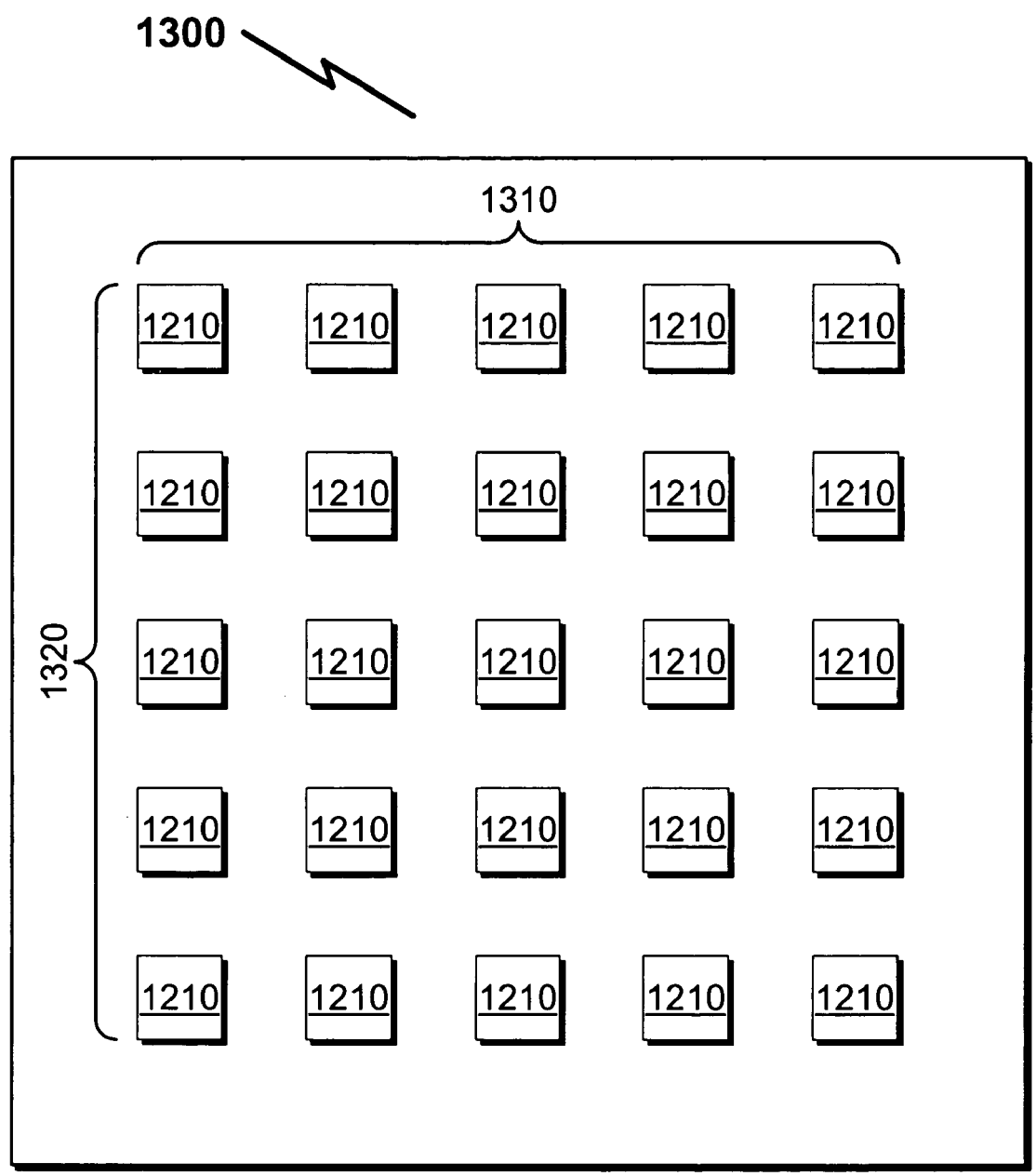
FIG. 13 illustrates an exemplary active element phased antenna array application using the teachings of the present invention.

The amplifier subsystem (1210) illustrated in FIG. 12 (1200) may be arrayed as illustrated in FIG. 13 (1300) in both the X-direction (1310) and the Y-direction (1320) to form a phased antenna array. While the array elements (1210) of the phased antenna array (1300) are optimally active systems as illustrated in FIG. 12 (1200), one skilled in the art will readily recognize that the same principles may be applied to phased antenna arrays that are comprised primarily (or solely) of passive inductor and/or capacitor elements.

Figure 3:
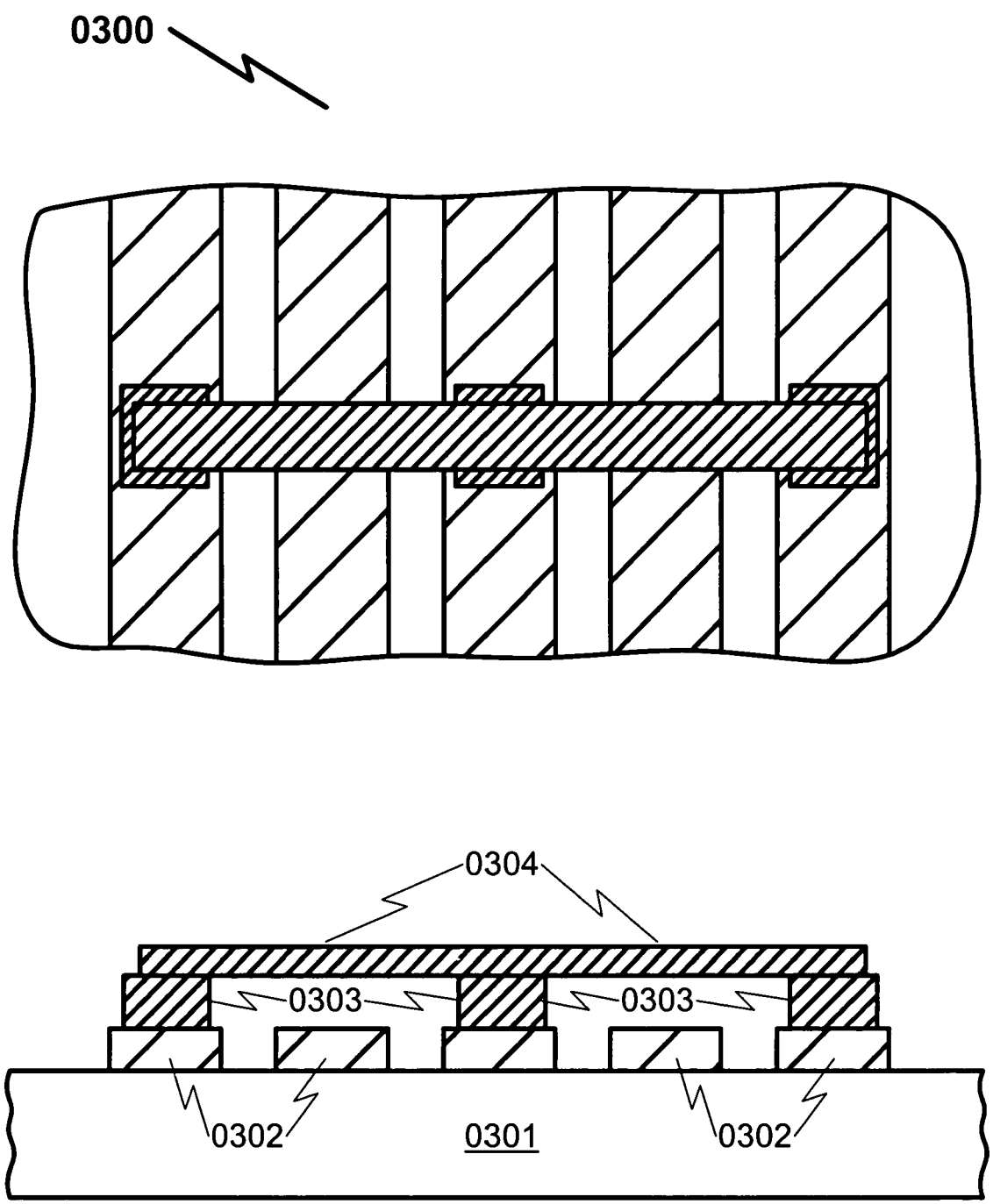
FIG. 3 illustrates a prior art air-bridge interconnect structure.

The advantage of the present invention over the prior art in this application is significant. Traditional phased antenna arrays utilizing capacitors/inductors/interconnect generally comprise components fabricated using crossover spans as illustrated in FIG. 3 (0300) and FIG. 4 (0400). As mentioned previously, the crossover spans (0304) in this technique are particularly susceptible to damage/collapse because of their fragile nature. The use of polyimide supports (0403) in this application partially solves this problem, but does so only at the expense of added manufacturing cost. Given that tens of thousands of the array elements (1210) may be present in phased antenna array, this additional cost and reduced reliability of the prior art is a significant hindrance to the implementation of integrated phased antenna array structures.

Furthermore, the crossover bridge (0304) technique illustrated in FIGS. 3–4 does not generate the same capacitance per unit area performance as is possible with the present invention. This is because the area of the entire crossover span structure of FIGS. 3–4 is greater than that of the present invention, and its effective capacitance per unit area is thus less than that of the present invention. Finally, the additional connection lead structures associated with the crossover span (0304) introduce additional parasitic inductance into the capacitance structure, thus reducing its resonant frequency and making it unsuitable for some very high frequency applications.

Thus, the present invention specifically anticipates the use of the thin film capacitor/inductor/interconnect structures described herein in both active and passive phased antenna arrays. These phased antenna arrays have wide application as is well known to one skilled in the art.

EXEMPLARY SYSTEM COMPONENT CHARACTERISTICS

Capacitor Performance (1500)

FIG. 15 (1500) illustrates typical modeled performance of capacitors using the teachings of the present invention. Key to interpretation of this graph is the fact that the capacitor structure operates below the self-resonant point (1501) with capacitive behavior (1502), but above this point it appears to have inductive characteristics (1503). This is typical of all hybrid capacitor structures, but the advantage in the present invention is that the self-resonant point (1501) is higher than comparable prior art solutions, with lower effective series resistance.

Fabricated capacitor test structures using the teachings of the present invention had remarkably consistent capacitance values in the 15–30 pF range and self-resonant frequencies ranging from 1.4–2.4 GHz, which is more than sufficient performance for many RF/wireless applications and significantly better than comparable prior art capacitor structures.

Inductor Performance (1600)

FIG. 16 (1600) illustrates typical modeled performance of inductors using the teachings of the present invention. Key to interpretation of this graph is the fact that the inductor structure operates below the self-resonant point (1601) with inductive behavior (1602), but above this point it appears to have capacitive characteristics (1603). This is typical of all hybrid inductor structures, but the advantage in the present invention is that the self-resonant point (1601) and quality factor (Q) are higher than comparable prior art solutions, since the present invention inductors have lower series resistance values and tighter inductive coupling with lower parasitic capacitance.

Fabricated inductor test structures using the teachings of the present invention had remarkably consistent inductance values in the 20–70 nH range and quality factors (Q) ranging from 22 at 2 GHz (20 nH) to 14 at 800 MHz (70 nH). While this performance analysis is preliminary, it does indicate that the present invention teachings permit inductors to be fabricated with significantly higher reliability, manufacturability, and performance than possible with the prior art.

CONCLUSION

A system and method for the fabrication of high reliability capacitors, inductors, and multi-layer interconnects on various substrate surfaces has been disclosed. The disclosed method first employs a thin metal layer deposited and patterned on the substrate. This thin patterned layer is used to provide both lower electrodes for capacitor structures and interconnects for upper electrode components. Next, a dielectric layer is deposited over the thin patterned layer and the dielectric layer is patterned to open contact holes to the thin patterned layer. The upper electrode layer is then deposited and patterned on top of the dielectric.

Although a preferred embodiment of the present invention has been illustrated in the accompanying drawings and described in the foregoing detailed description, it will be understood that the invention is not limited to the embodiments disclosed, but is capable of numerous rearrangements, modifications, and substitutions without departing from the spirit of the invention as set forth and defined by the following claims:

What is claimed is:

1. A thin film capacitor/inductor/interconnect method comprising:
   (a) thinly metalizing a substrate with a lower electrode and interconnect layer formed on said thin film hybrid substrate, said layer further comprising a lower adhesive layer and an upper conducting layer having a sum total thickness of less than or equal to 1.5 microns;
   (b) applying/imaging photoresist and etching to form metal patterns on said substrate for lower capacitor electrodes and interconnect;
   (c) applying a thin dielectric layer to said metal patterns;
   (d) applying/imaging photoresist and etching to form contact holes in said dielectric layer and optionally selectively patterning said dielectric layer;
   (e) metalizing said substrate to make contact with said lower capacitor electrodes and interconnect;
   (f) applying/imaging photoresist and etching to form patterns for upper capacitor electrodes, inductors, and/or interconnect conductors;
   (g) optionally forming resistor elements by applying/imaging photoresist and etching a resistor layer on said substrate;
   wherein
   said upper conducting layer is approximately 0.25 microns thick.

2. The thin film hybrid substrate method of claim 1, wherein said lower adhesive layer is approximately 0.03 to 0.05 microns thick.

3. The thin film hybrid substrate method of claim 1, wherein said lower adhesive layer comprises chrome.

4. The thin film hybrid substrate method of claim 1, wherein said lower adhesive layer comprises titanium.

5. The thin film hybrid substrate method of claim 1, wherein said lower adhesive layer comprises titanium-tungsten.

6. The thin film hybrid substrate method of claim 1, wherein said upper conducting layer comprises silver.

7. The thin film hybrid substrate method of claim 1, wherein said upper conducting layer comprises aluminum.

8. The thin film hybrid substrate method of claim 1, wherein said upper conducting layer comprises gold.

9. The thin film hybrid substrate method of claim 1, wherein said upper conducting layer comprises copper.

10. The thin film hybrid substrate method of claim 1, wherein said lower electrode and interconnect layer further comprises silver.

11. The thin film hybrid substrate method of claim 1, wherein said lower electrode and interconnect layer further comprises aluminum.

12. The thin film hybrid substrate method of claim 1, wherein said lower electrode and interconnect layer further comprises gold.

13. The thin film hybrid substrate method of claim 1, wherein said lower electrode and interconnect layer further comprises copper.

14. The thin film hybrid substrate method of claim 1, wherein said lower electrode and interconnect layer is selected from the group consisting of tantalum, tungsten, titanium, nickel, molybdenum, platinum, palladium, and chromium.

15. The thin film hybrid substrate method of claim 1, wherein said dielectric layer is selectively patterned.

16. The thin film hybrid substrate method of claim 1, wherein said dielectric layer further comprises silicon nitride.

17. The thin film hybrid substrate method of claim 1, wherein said dielectric layer further comprises silicon dioxide.

18. The thin film hybrid substrate method of claim 1, wherein said dielectric layer further comprises silicon oxynitride.

19. The thin film hybrid substrate method of claim 1, wherein said dielectric layer further comprises aluminum oxide.

20. The thin film hybrid substrate method of claim 1, wherein said dielectric layer further comprises tantalum pentoxide.

21. The thin film hybrid substrate method of claim 1, wherein said dielectric layer further comprises a ferroelectric material.

22. The thin film hybrid substrate method of claim 21, wherein said ferroelectric material is $BaTiO_3$.

23. The thin film hybrid substrate method of claim 21, wherein said ferroelectric material is $SrTiO_3$.

24. The thin film hybrid substrate method of claim 21, wherein said ferroelectric material is $PbZrO_3$.

25. The thin film hybrid substrate method of claim 21, wherein said ferroelectric material is $PbTiO_3$.

26. The thin film hybrid substrate method of claim 21, wherein said ferroelectric material is $LiNbO_3$.

27. The thin film hybrid substrate method of claim 21, wherein said ferroelectric material is $Bi_{14}Ti_3O_{12}$.

28. The thin film hybrid substrate method of claim 1, wherein said dielectric layer further comprises polyimide.

29. The thin film hybrid substrate method of claim 1, wherein said dielectric layer further comprises benzocyclobutene.

30. The thin film hybrid substrate method of claim 1, wherein said substrate material is selected from the group consisting of alumina, beryllium oxide, fused silica, aluminum nitride, sapphire, ferrite, diamond, LTCC, and glass.

* * * * *